(12) United States Patent
Ihs et al.

(10) Patent No.: US 8,274,415 B2
(45) Date of Patent: Sep. 25, 2012

(54) SIGMA-DELTA MODULATOR APPARATUS AND METHOD OF GENERATING A MODULATED OUTPUT SIGNAL

(75) Inventors: Hassan Ihs, Edinburgh (GB); Frederic Schrive, Saverdun (FR)

(73) Assignee: Freescale Semiconductor, Inc., Austin, TX (US)

( * ) Notice: Subject to any disclaimer, the term of this patent is extended or adjusted under 35 U.S.C. 154(b) by 89 days.

(21) Appl. No.: 12/866,248

(22) PCT Filed: Feb. 13, 2008

(86) PCT No.: PCT/IB2008/051780
§ 371 (c)(1),
(2), (4) Date: Aug. 5, 2010

(87) PCT Pub. No.: WO2009/101486
PCT Pub. Date: Aug. 20, 2009

(65) Prior Publication Data
US 2011/0006938 A1    Jan. 13, 2011

(51) Int. Cl.
*H03M 3/00* (2006.01)
(52) U.S. Cl. .................................. 341/143; 341/155
(58) Field of Classification Search .................. 341/143, 341/155
See application file for complete search history.

(56) References Cited

U.S. PATENT DOCUMENTS

| | | | | |
|---|---|---|---|---|
| 5,777,512 A | * | 7/1998 | Tripathi et al. | 330/207 A |
| 7,042,377 B2 | * | 5/2006 | Oliaei | 341/143 |
| 7,084,799 B1 | | 8/2006 | Butler | |
| 2004/0190728 A1 | * | 9/2004 | Melanson | 381/71.8 |

FOREIGN PATENT DOCUMENTS

| | | |
|---|---|---|
| EP | 1347579 A | 9/2003 |
| WO | 97/49175 A | 12/1997 |
| WO | 2006/079869 A | 8/2006 |

OTHER PUBLICATIONS

International Search Report and Written Opinion correlating to PCT/IB2008/051780 dated Oct. 1, 2008.

* cited by examiner

*Primary Examiner* — Jean B Jeanglaude

(57) ABSTRACT

A discrete time sigma-delta modulator apparatus for class-D operation comprises a feed-forward path having an input at one end thereof and an output at another end thereof. A first summation unit is coupled in the feed-forward path to a first integrator. A quantizer is coupled in the feed-forward path after the first integrator and a feedback path arrangement is coupled to an input of the first summation unit. A low pass filter is arranged in the feedback path arrangement so as only to drive the first integrator.

20 Claims, 3 Drawing Sheets

SIGMA-DELTA MODULATOR APPARATUS AND METHOD OF GENERATING A MODULATED OUTPUT SIGNAL

FIELD OF THE INVENTION

This invention relates to a sigma-delta modulator apparatus for class-D operation of the type that, for example, generates a pulsed output signal in response to an input signal, for example, to drive a load, such as a loudspeaker. The invention also related to a method of generating a modulated output signal of the type that, for example, is generated in response to an input signal, for example, to drive a load, such as a loudspeaker.

BACKGROUND OF THE INVENTION

In the field of amplifier circuits, there exist a number of classes of amplifier. For applications where high power audio amplification is required but where power consumption has to be low, it is known to employ so-called "class-D" amplifiers. For high power audio applications, class-D amplifiers are the most efficient of all the classes of amplifier.

A class-D amplifier circuit converts an input signal, for example an audio signal, into a sequence of pulses having an average value directly proportional to the amplitude of the input signal at the time of conversion. The frequency of the pulses is typically ten or more times the Nyquist rate. The output of the class-D amplifier therefore is a train of pulses having a characteristic that is a function of the amplitude and frequency of the input signal being amplified. One type of class-D amplifier circuit is known to comprise a Sigma-Delta modulator.

A Sigma-Delta modulator, particularly a second order Sigma-Delta modulator, comprises a first summation unit coupled to a first integrator, the first integrator being coupled to a second integrator via a second summation unit. An output of the second integrator is coupled to a quantizer, an output of the quantizer being coupled to a feedback loop. For class-D amplifier circuits, the output of the quantizer is coupled to an input of a load driver circuit. The feedback loop feeds the output of the quantizer to the first summation unit and the second summation unit. The load driver circuit is coupled to a load, for example a loudspeaker that responds audibly to the output signal of the driver circuit. In the case of the Sigma-Delta modulator, the density of the train of pulses constituting a modulated output signal is a function of the amplitude and frequency of the input signal being processed, i.e. the output signal of the quantizer is a Pulse Density Modulation (PDM) signal. The output signal of the load driver circuit is therefore also a modulated signal.

Undesirably, the PDM output signal contains, in addition to the input signal information, unwanted spectral components. In particular, traditional class-D amplifier circuits including Sigma-Delta modulators suffer from the presence of harmonic distortions in the output signal as well as DC offset and an increase in the so-called "noise floor".

In particular, and in relation to switched capacitor ("switch-cap") implementations of the Sigma-Delta modulator, the output signal of the load driver circuit is processed by the load as a square wave including "spikes", but the switched capacitor integrators process the output signal as a substantially perfect square wave. This results in the output signal containing odd-order harmonic distortions as well as a Direct Current (DC) offset. Additionally, due to rise time/fall time mismatches due to field effect devices of the output driver circuit not being perfectly matched, the output signal also contains even-order harmonic distortions. Also, as a result of so-called "clock jitter", the noise floor of the output signal is further increased. Whilst the clock jitter can be obviated or at least mitigated, the solution requires an expensive very low phase noise Phase Locked Loop (PLL) to supply the clock signal for the Sigma-Delta modulator as well as the provision of bulky devices external to an integrated circuit containing the Sigma-Delta modulator.

Patent Cooperation Treaty publication no. WO 2006079869 A relates to a class-D amplifier circuit that feeds the output of the driver circuit back to the first and second integrators instead of the output of the quantizer. Whilst this circuit architecture mitigates noise caused by the power supply to the amplifier circuit, DC offset and harmonic distortions of the type described above are still present in the output signal. Also, noise resulting from clock jitter is still present in the output signal.

SUMMARY OF THE INVENTION

According to the present invention, there is provided a sigma-delta modulator apparatus for class-D operation as set forth in the appended claims. According to the present invention, there is also provided a method of generating a modulated output signal as set forth in the appended claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

At least one embodiment of the invention will now be described, by way of example only, with reference to the accompanying drawings, in which.

DESCRIPTION OF EMBODIMENTS

Figure 1:
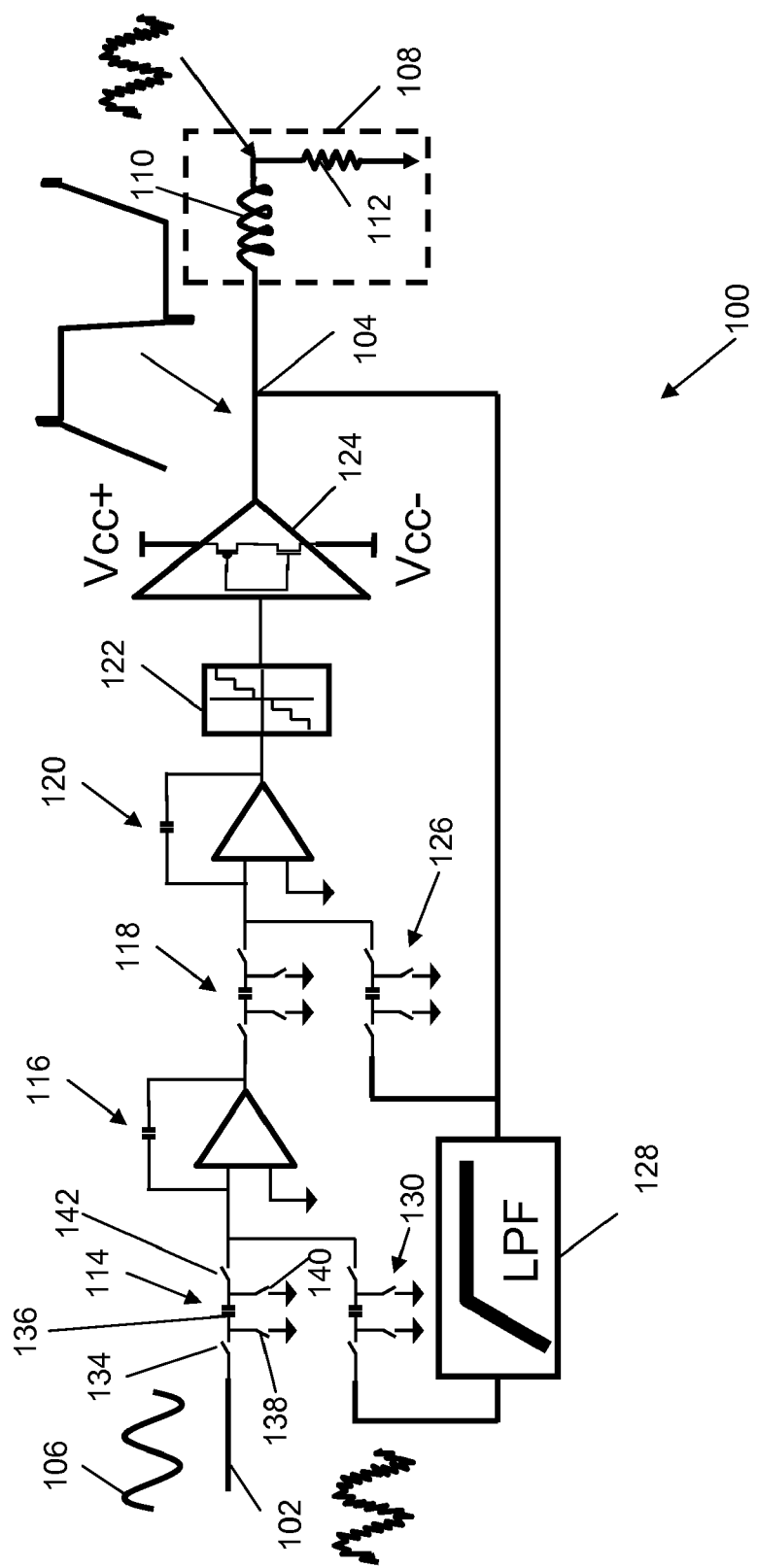
FIG. 1 is a schematic diagram of an apparatus constituting a first embodiment of the invention.

Throughout the following description identical reference numerals will be used to identify like parts.

Embodiments of the invention will be described in terms of a system-on-chip (SoC). Although embodiments of the invention will be described in terms of the system-on-chip (SoC), it will be appreciated that the inventive concept described herein may be embodied in any apparatus that is not, or partially, a SoC implementation.

Referring to FIG. 1, a sigma-delta (Σ-Δ) modulator apparatus 100 may comprise an input terminal 102 and an output terminal 104, the input terminal 102 being coupled to a source (not shown) of an input signal 106, for example an audio signal in a portable communications device, such as a cellular handset, and the output terminal 104 being coupled to a load 108, for example a loudspeaker of the portable communications apparatus, having an inductive load 110 and a resistive load 112. In this example, the impedance of the load is 4Ω or 8Ω, though the skilled person will appreciate that other loads can be employed where appropriate circumstances dictate so.

The input terminal 102 is coupled to a first terminal of a first switched capacitor unit 114. The first switched capacitor unit 114 may comprise a first terminal of a first switching device 134 constituting the first terminal of the first switched capacitor unit 114, for example a Field Effect Transistor (FET) device, such as an N-type Metal Oxide Semiconductor (NMOS) FET, although the skilled person will appreciate that other types of appropriate threshold-dependent switching devices can be employed. A second terminal of the first switching device 134 is coupled to a first terminal of a capacitor 136 and a first terminal of a second switching device 138. A second terminal of the capacitor 136 is coupled to a first terminal of a third switching device 140 and a first terminal of a fourth switching device 142. Second terminals of the second and third switching devices 138, 140 are coupled to ground potential and a second terminal of the fourth switching device 142, constituting a second terminal of the first switched capacitor unit 114, is coupled to an input terminal of a first integrator 116. The above-described structure of the first switched capacitor unit 114 is employed for other switched capacitor units described herein and so, for the sake of conciseness, will not be described in further detail herein.

An output terminal of the first integrator 116 is coupled to a first terminal of a second switched capacitor unit 118, a second terminal of the second switched capacitor unit 118 being coupled to an input terminal of a second integrator 120. An output terminal of the second integrator 120 is coupled to an input terminal of a quantizer 122, an output terminal of the quantizer 122 being coupled to an input terminal of a driver circuit 124. If 1-bit quantization is required, the quantizer 122 can be a comparator.

An output terminal of the driver circuit 124 is coupled to an input terminal of the load 108 and a first terminal of a third switched capacitor unit 126, a second terminal of the third switched capacitor unit 126 being coupled to the second terminal of the second switched capacitor unit 118 and the input terminal of the second integrator 120. The output terminal of the driver circuit 124 and the first terminal of the third switched capacitor unit 126 are also coupled to an input terminal of a low-pass filter 128, an output terminal of the low-pass filter 128 being coupled to a first terminal of a fourth switched capacitor unit 130. In this example, the low-pass filter 128 is a passive filter, for example a Resistor-Capacitor (RC) circuit. The low pass filter 128 has a cut-off frequency that is less than a running frequency, or clocking frequency, of the Σ-Δ modulator apparatus 100, for example ten times lower than the running frequency.

A second terminal of the fourth switched capacitor unit 130 is coupled to the second terminal of the first switched capacitor unit 114 and the input terminal of the first integrator 116. The first switched capacitor unit 114, the first integrator 116, the second switched capacitor unit 118, the second integrator 120 and the quantizer 122 provide a so-called "feed-forward" path between the input terminal 102 and the output terminal 104. The coupled first and fourth switched capacitor units 114, 130 constitute a first summation unit, and the coupled second and third switched capacitor units 118, 126 constitute a second summation unit. Also, a path from the output terminal of driver circuit 124 to the second summation unit and the first summation unit via the low-pass filter 128 constitutes a feedback path.

In operation, the input signal 106 is applied to the input terminal 102 of the Σ-Δ modulator apparatus 100 and processed by the first switched capacitor unit 114, the first integrator 116, the second switched capacitor unit 118, the second integrator 120 and the quantizer 122 in order to generate a Pulse Density Modulation (PDM) output signal. As this aspect of Σ-Δ modulators is known, this aspect will not be described further for the sake of simplicity and conciseness of description. The PDM output signal is then amplified by the driver circuit 124 to produce an amplified modulated output signal.

A proportion of the amplified modulated output signal is fed back to both the second summation unit and the first summation unit. However, in respect of the first summation unit, the low-pass filter 128 also drives the first summation unit, in particular in this example, the fourth switched capacitor unit 130. In contrast, the low-pass filter 128 does not drive the second summation unit. Consequently, after amplification of the PDM output signal, the load 108 receives the amplified modulated output signal as a substantially square wave signal having "spikes" on the rising and falling edges thereof. Due to the presence of the low-pass filter 128, the fourth switched capacitor unit 130 does not receive a substantially "perfect" square wave, but instead receives an integrated version of the amplified modulated output signal, and is a reproduction of the signal across the resistive load 112. In this respect, by way of example, if the input signal 106 is a sine wave, an output signal of the driver circuit 124 is the amplified modulated output signal mentioned above and a signal across the resistive load 112 may comprise the input sine wave but also high frequency noise due to Sigma-Delta modulation processing. Without the presence of the low-pass filter 128, the signal received by the fourth switched capacitor unit 130 is the amplified PDM output signal, i.e. the output signal of the driver circuit 124. However, with the presence of the low-pass filter 128, the signal received by the fourth switched capacitor unit 130 is the same signal as the signal across the resistive load 112. The low-pass filter 128 transforms the amplified PDM output signal mentioned above into the representation of the signal present across the resistive load 112, as mentioned above. To accurately reproduce the signal across the resistive load 112, the cut-off frequency of the low-pass filter 128 has to be equal or close to the cut-off frequency of the load 108.

As a result of the above processing, the amplified modulated output signal used to drive the load 108 has improved characteristics in respect of DC offset, noise floor, and the presence of harmonic distortions. By placing the low-pass filter 128 in the feedback path, all the non-idealities mentioned above become noise-shaped due to the noise shaping property possessed by Sigma Delta modulators. For example, in respect of the second-order Sigma-Delta modulator of FIG. 1, quantization noise due to the quantizer 122 is noise-shaped with a second-order noise transfer function, and as a result, most of the quantization noise is rejected at high frequencies. If the Sigma-Delta modulator output is low-pass filtered, then the remaining noise is low. The low-pass filtering function is achieved by both the load 108 and the internal components of the low-pass filter 128. Additionally, in this embodiment, noise caused by the power supply (not shown) for the Σ-Δ modulator apparatus 100 is reduced, i.e. the Power Supply Noise Rejection Ratio of the Σ-Δ modulator apparatus 100 is improved.

Figure 2:
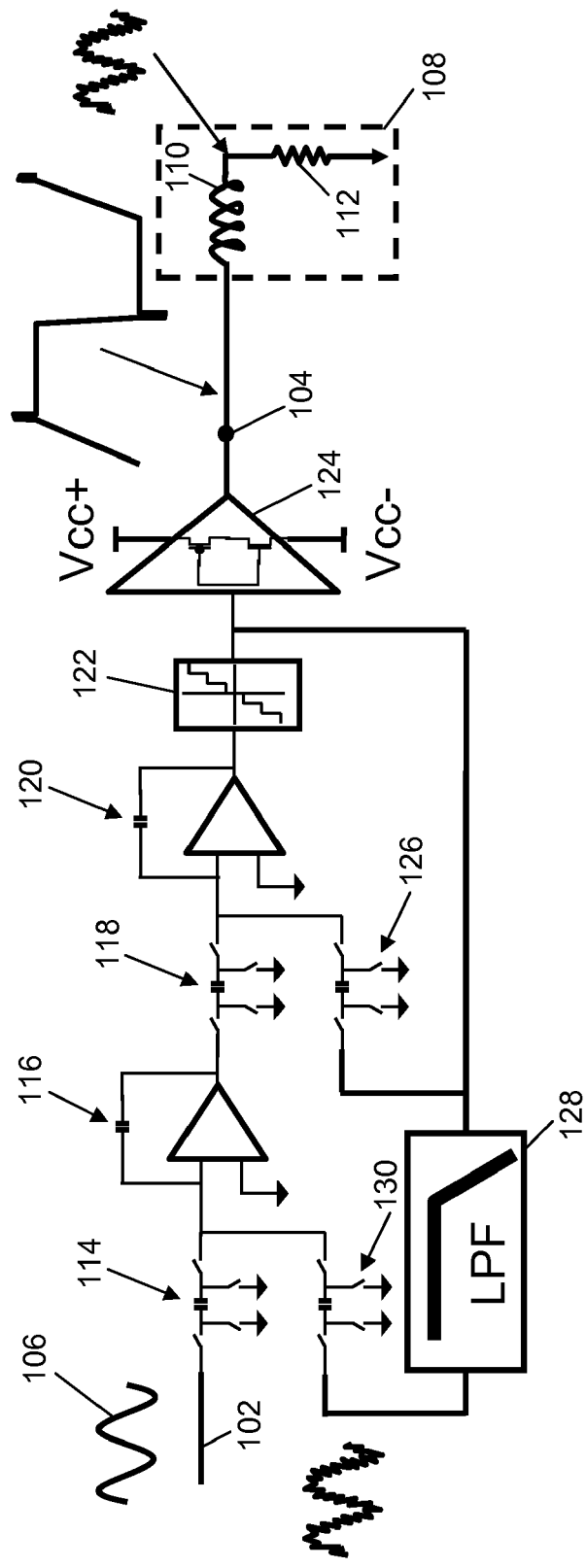
FIG. 2 is a schematic diagram of an apparatus constituting a second embodiment of the invention.

In another embodiment (FIG. 2), a variant of the Σ-Δ modulator apparatus 100 of the previous embodiment may comprise a different feedback path arrangement. In this embodiment, the sigma-delta (Σ-Δ) modulator apparatus 100 may comprise the input terminal 102 and the output terminal 104, the input terminal 102 being coupled to the source (not shown) of the input signal 106, and the output terminal 104 being coupled to the load 108, for example a loudspeaker having an inductive load 110 and a resistive load 112. In this example, the impedance of the load is 4Ω or 8Ω, though the skilled person will appreciate that other loads can be employed where appropriate circumstances dictate so.

The input terminal 102 is coupled to the first terminal of the first switched capacitor unit 114, the second terminal of the first switched capacitor unit 114 being coupled to the input of the first integrator 116. The output terminal of the first integrator 116 is coupled to the first terminal of the second switched capacitor unit 118, the second terminal of the second switched capacitor unit 118 being coupled to the input terminal of the second integrator 120. The output terminal of the second integrator 120 is coupled to the input terminal of the quantizer 122, the output terminal of the quantizer 122 being coupled to the input terminal of the driver circuit 124.

The output terminal of the driver circuit 124 is coupled to the input terminal of the load 108. The output terminal of the quantizer 122 is coupled to the first terminal of the third switched capacitor unit 126, the second terminal of the third switched capacitor unit 126 being coupled to the second terminal of the second switched capacitor unit 118 and the input terminal of the second integrator 120. The output terminal of the quantizer 122 and the first terminal of the third switched capacitor unit 126 are also coupled to the input terminal of the low-pass filter 128, the output terminal of the low-pass filter 128 being coupled to the first terminal of the fourth switched capacitor unit 130. In this example, the low-pass filter 128 is a passive filter, for example a Resistor-Capacitor (RC) circuit. The cut-off frequency of the low-pass filter 128 is less than the running frequency, or clocking frequency, of the Σ-Δ modulator apparatus 100, for example ten times lower than the running frequency.

The second terminal of the fourth switched capacitor unit 130 is coupled to the second terminal of the first switched capacitor unit 114 and the input terminal of the first integrator 116. In this embodiment, the first switched capacitor unit 114, the first integrator 116, the second switched capacitor unit 118, the second integrator 120 and the quantizer 122 also provide the feed-forward path between the input terminal 102 and the output terminal 104. The coupled first and fourth switched capacitor units 114, 130 also constitute the first summation unit, and the coupled second and third switched capacitor units 118, 126 constitute the second summation unit. Also, a path from the output terminal of the quantizer 122 to the second summation unit and the first summation unit via the low-pass filter 128 constitutes the feedback path in this embodiment. In this respect, instead of the feedback path commencing from the output terminal of the driver circuit 124 as in the first embodiment, the feedback path is formed by coupling the output terminal of the quantizer 122 and the input terminal of the driver circuit 124 to the first terminal of the third switched capacitor unit 126 and the input terminal of the low-pass filter 128. The output terminal of the low-pass filter 128 remains coupled to the first terminal of the fourth switched capacitor circuit 130.

In operation, operation of the Σ-Δ modulator apparatus 100 is similar to the operation of the Σ-Δ modulator apparatus 100 of the previous embodiment. However, instead of a proportion of the amplified modulated output signal being fed back on the feedback path, a proportion of the PDM output signal is fed back to the second summation unit and the first summation unit. As in the case of the previous embodiment, the low-pass filter 128 filters the proportion of the PDM output signal being fed back to the first summation unit, i.e. so that only the first summation unit is driven by a low-pass filtered version of the fed-back proportion of the PDM output signal.

Consequently, after amplification of the PDM output signal, the load 108 receives the amplified modulated output signal as a substantially square wave signal having "spikes" on the rising and falling edges thereof. Due to the presence of the low-pass filter 128, the fourth switched capacitor unit 130 does not receive a substantially "perfect" square wave, but instead receives an integrated version of the amplified modulated output signal, which is a reproduction of the signal across the resistive load 112 as described above in relation to the previous embodiment.

As a result of the above processing, the amplified modulated output signal used to drive the load 108 has improved characteristics in respect of DC offset, noise floor, and the presence of harmonic distortions. By placing the low-pass filter 128 in the feedback path, all the non-idealities mentioned above become noise-shaped due to the noise-shaping property possessed by Sigma Delta modulators.

Figure 3:
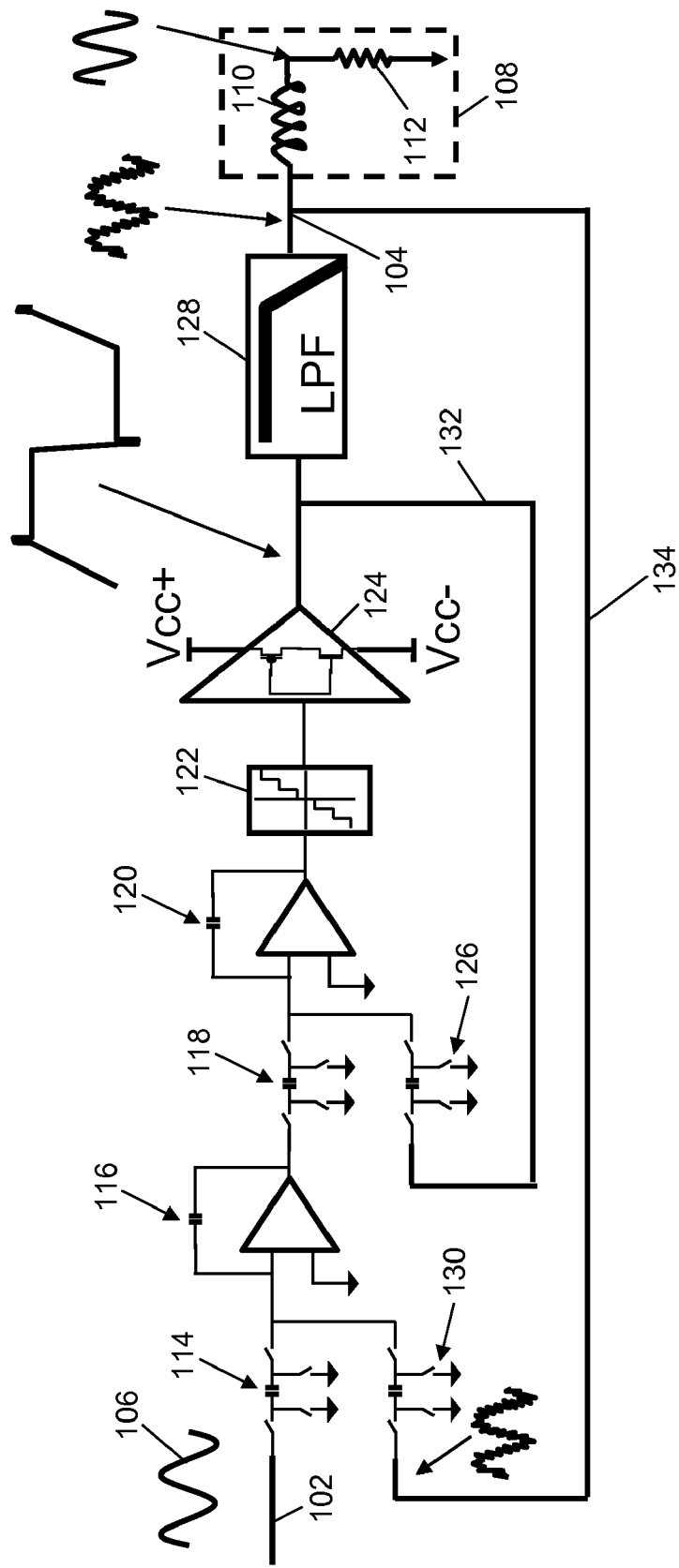
FIG. 3 is a schematic diagram of an apparatus constituting a third embodiment of the invention.

Turning to FIG. 3, in another embodiment a variant of the Σ-Δ modulator apparatus 100 of the first embodiment may comprise a different feedback path arrangement. In this embodiment, the sigma-delta (Σ-Δ) modulator apparatus 100 may comprise the input terminal 102 and the output terminal 104, the input terminal 102 being coupled to the source (not shown) of the input signal 106, and the output terminal 104 being coupled to the load 108, for example a loudspeaker having an inductive load 110 and a resistive load 112. In this example, the impedance of the load is 4Ω or 8Ω, though the skilled person will appreciate that other loads can be employed where appropriate circumstances dictate so.

The input terminal 102 is coupled to the first terminal of the first switched capacitor unit 114, the second terminal of the first switched capacitor unit 114 being coupled to the input of the first integrator 116. The output terminal of the first integrator 116 is coupled to the first terminal of the second switched capacitor unit 118, the second terminal of the second switched capacitor unit 118 being coupled to the input terminal of the second integrator 120. The output terminal of the second integrator 120 is coupled to the input terminal of the quantizer 122, the output terminal of the quantizer 122 being coupled to the input terminal of the driver circuit 124. The output terminal of the driver circuit 124 is coupled to the input terminal of the load 108 through the low-pass filter 128.

In this embodiment, the first switched capacitor unit 114, the first integrator 116, the second switched capacitor unit 118, the second integrator 120 and the quantizer 122 also provide the feed-forward path between the input terminal 102 and the output terminal 104. The coupled first and fourth switched capacitor units 114, 130 also constitute the first summation unit, and the coupled second and third switched capacitor units 118, 126 constitute the second summation unit.

The output terminal of the driver circuit 124 is coupled to the second summation unit, in this example, via the first terminal of the third switched capacitor unit 126 of the second summation unit, in order to form a first feedback path 132. A first side of the low-pass filter 128 is also coupled to the output terminal of the driver circuit 124, a second side of the low-pass filter 128 being coupled to the output terminal 104 and the first summation unit, in this example, via the first terminal of the fourth switched capacitor unit 130 of the first summation unit. The path through the low-pass filter 128 and the coupling of the output terminal 104 to the first summation unit constitutes a second feedback path 134. Together, the first and second feedback paths constitute a feedback path arrangement.

In this embodiment, the low-pass filter 128 is not part of an integrated circuit forming the first, second, third and fourth switched capacitor units 114, 118, 126, 130, the first and second integrators 116, 120, the quantizer 122 and the driver circuit 124. Instead, the low-pass filter 128 is an external circuit device. In this example, the low-pass filter 128 is a passive device, such as an Inductor-Capacitor (LC) circuit.

The cut-off frequency of the low-pass filter 128 is less than the running frequency, or clocking frequency, of the Σ-Δ modulator apparatus 100, for example ten times lower than the running frequency.

The second terminal of the third switched capacitor unit 126 is coupled to the second terminal of the second switched capacitor unit 118 and the input of the second integrator 120. The second terminal of the fourth switched capacitor unit 130 is coupled to the second terminal of the first switched capacitor unit 114 and the input terminal of the first integrator 116.

Hence, it can be seen that in this embodiment the feedback path arrangement is formed by coupling the output terminal of the driver circuit 124 to the first terminal of the third switched capacitor unit 126 and the input terminal of the low-pass filter 128. The output terminal of the low-pass filter 128 remains coupled to the first terminal of the fourth switched capacitor circuit 130, but also the output terminal 104.

In operation, operation of the Σ-Δ modulator apparatus 100 is similar to the operation of the Σ-Δ modulator apparatus 100 of the first embodiment. A proportion of the amplified modulated output signal is fed back on the first feedback path to the second summation unit. However, a remaining proportion of the amplified modulated output signal is subjected to the low-pass filter 128 and the filtered output signal applied to the first summation unit. The switched capacitor second summation unit receives the fed-back proportion of the amplified modulated output signal in the same way as the first embodiment, namely as a substantially "perfect" square wave signal. However, the low-pass filter 128 filters the remaining proportion of the amplified modulated output signal so that, of the summation units in the feed-forward path, only the first summation unit is driven by a low-pass filtered version of the fed-back remaining proportion of the amplified modulated output signal. Due to the presence of the low-pass filter 128, the fourth switched capacitor unit 130 does not receives a substantially "perfect" square wave, but instead receives an integrated version of the amplified modulated output signal, which is substantially the same signal received by the load 108.

Whilst, as a result of the above processing, the amplified modulated output signal used to drive the load 108 has improved characteristics in respect of DC offset, noise floor, and the presence of harmonic distortions. By driving the fourth switched capacitor unit 130 with an integrated version of the amplified modulated output signal, i.e. the output of the low-pass filter 128, all the non-idealities mentioned above become noise-shaped due to the noise-shaping property possessed by Sigma Delta modulators.

It should be appreciated that although the above embodiments have been described as implementation independent circuits, with the exception of the third embodiment described herein, the Σ-Δ modulator apparatus 100 can be formed as an integrated circuit of a semiconductor device. In respect of the third embodiment, integration of the Σ-Δ modulator apparatus 100 is still possible apart from the low-pass filter 128, which is formed as the LC circuit due to the high currents that would otherwise be drawn by a resistor of an RC filter circuit.

The above examples have been described as comprising second order sigma-delta modulators. However, the skilled person should appreciate that any order sigma-delta modulators can be employed, for example, a first order sigma-delta modulator, or a sigma-delta modulator of order greater than two, for example a third order sigma-delta modulator. In this respect, the low-pass filter 128 is still coupled to the first summation unit of the Σ-Δ modulator apparatus 100 irrespective of the order of the sigma-delta modulator employed. Hence, the summation unit closest the input (102) is driven by the low-pass filter 128.

In the above embodiments, in order to provide stability, the real parts of the poles of the Noise Transfer Function of the Sigma-Delta modulator, i.e. including the low-pass filter 128, are negative. For the avoidance of doubt, it should be understood that the sigma-delta modulator as described herein should be construed as including the low-pass filter. Indeed, the sigma-delta modulator is a modified version of the known sigma-delta modulator, and the skilled person should appreciate that references herein to the sigma-delta modulator are references to the modified sigma-delta architecture.

It is thus possible to provide a discrete time Σ-Δ modulator apparatus for class-D operation and a method of generating a high quality modulated output signal having a reduced noise floor attributable to clock jitter as well as high signal linearity, i.e. significantly attenuated even- and odd-order harmonic distortions in the output signal. Also, in some embodiments, the Power Supply Noise Rejection Ratio of the output signal is improved. Furthermore, the circuit architecture provided is simple and does not involve additional components that need to be provided external to an integrated circuit implementing the discrete time Σ-Δ modulator apparatus. Of course, the above advantages are exemplary, and these or other advantages may be achieved by the invention. Further, the skilled person will appreciate that not all advantages stated above are necessarily achieved by embodiments described herein.

The invention claimed is:

1. A discrete time sigma-delta modulator apparatus for class-D operation, the apparatus comprising:
   a feed-forward path having an input at one end thereof and an output at another end thereof;
   a first summation unit coupled in the feed-forward path to a first switched capacitor integrator;
   a quantizer coupled in the feed-forward path after the first switched capacitor integrator;
   a feedback path coupled to an input terminal of the first summation unit;
   a low pass filter having an input terminal coupled to an output terminal of the quantizer, and an output terminal coupled to a load via the output of the feed-forward path and to the input terminal of the first summation unit via the feedback path; and
   wherein the apparatus has a modulator running frequency;
   wherein the low pass filter has a cut-off frequency, the cut-off frequency of the low pass filter being less than the modulator running frequency.

2. An apparatus as claimed in claim 1, further comprising:
   a second integrator coupled to the first integrator in the feed forward path via a second summation unit;
   wherein the quantizer is coupled in the feed forward path to an output of the second integrator; and
   wherein the feedback path arrangement is also coupled to an output of the second summation unit.

3. An apparatus as claimed in claim 2, wherein a second feedback path extends from the output terminal of the quantizer to an input terminal of the second summation unit.

4. An apparatus as claimed in claim 2, wherein:
   the input of the feed-forward path is coupled to another input of the first summation unit, an output of the first summation unit being coupled to an input of the first integrator;
   an output of the first integrator is coupled to another input of the second summation unit, an output of the second summation unit being coupled to an input of the second integrator; and the output of the second integrator is coupled to an input of the quantizer.

5. An apparatus as claimed in claim 2, wherein: the output terminal of the quantizer is coupled to an input terminal of the second summation unit.

6. An apparatus as claimed in claim 1, wherein the low pass filter is an RC circuit.

7. An apparatus as claimed in claim 1, wherein the low pass filter is an LC circuit.

8. A semiconductor device comprising the amplifier circuit apparatus as claimed in claim 7.

9. An apparatus as claimed in claim 1, wherein the apparatus has a noise transfer function having a pole, the pole having a negative real part.

10. An apparatus as claimed in claim 9, wherein:
the input of the feed-forward path is coupled to another input of the first summation unit, an output of the first summation unit being coupled to an input of the first integrator;
an output of the first integrator is coupled to another input of the second summation unit, an output of the second summation unit being coupled to an input of the second integrator; and
the output of the second integrator is coupled to an input of the quantizer.

11. An apparatus as claimed in claim 1, wherein the low pass filter is a passive filter.

12. An amplifier circuit apparatus comprising:
the discrete time sigma-delta modulator apparatus as claimed in claim 1; and
an output driver coupled between the output terminal of the quantizer and the output of the feed-forward path.

13. An apparatus as claimed in claim 12, wherein a second feedback path extends from an output of the output driver to an input terminal of a second summation unit.

14. An apparatus as claimed in claim 13, wherein:
an output of the output driver is coupled to the input terminal of the first summation unit; and
the output of the output driver is coupled to the input terminal of the first summation unit via the low pass filter.

15. An apparatus as claimed in claim 14, wherein the output of the output driver and the input terminal of the second summation unit are coupled to the input terminal of the low pass filter.

16. A semiconductor device comprising the amplifier circuit apparatus as claimed in claim 13.

17. An apparatus as claimed in claim 12, wherein:
the output terminal of the quantizer is coupled to the input terminal of the second summation unit.

18. A semiconductor device comprising the discrete time sigma-delta modulator apparatus as claimed in claim 1.

19. A method of generating a modulated output signal, the method comprising:
receiving an input signal;
providing a feed-forward path having an input and an output, the feed-forward path being provided by:
a first summation unit coupled to a first switched capacitor integrator, the first switched capacitor integrator being coupled to a quantizer;
applying the input signal to the feed-forward path so as to provide the modulated output signal at the output of the feed-forward path; and
a modulator running frequency;
feeding back a portion of the modulated output signal to an input of the first summation unit only; and
low pass filtering the portion of the modulated output signal fed back to the input of the first summation unit, the low pass filtering being with respect to a cut-off frequency less than the modulator running frequency.

20. A discrete time sigma-delta modulator apparatus for class-D operation, the apparatus comprising:
a feed-forward path between an input terminal and an output terminal of the apparatus;
a summation unit coupled in the feed-forward path, the summation unit having an input terminal coupled to the input terminal of the apparatus, and an output terminal coupled to an input terminal of a switched capacitor integrator;
a quantizer coupled in the feed-forward path, the quantizer having an input terminal coupled to an output terminal of the switched capacitor integrator, and an output terminal;
a drive circuit coupled having an input terminal coupled to the output terminal of the quantizer, and an output terminal coupled to a load;
a low pass filter in a feed-back path, the low pass filter having an input terminal coupled to the input terminal of the drive circuit, and an output terminal; and
a feedback path coupled between the output terminal of the quantizer and the input terminal of the summation unit, wherein the apparatus has a modulator running frequency, and wherein the low pass filter has a cut-off frequency, the cut-off frequency of the low pass filter being less than the modulator running frequency.

* * * * *